United States Patent
Yang et al.

(10) Patent No.: US 8,978,247 B2
(45) Date of Patent: Mar. 17, 2015

(54) TSV FABRICATION USING A REMOVABLE HANDLING STRUCTURE

(75) Inventors: Se Young Yang, Cupertino, CA (US); Cyprian Emeka Uzoh, San Jose, CA (US); Michael Huynh, Santa Clara, CA (US); Rajesh Katkar, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 297 days.

(21) Appl. No.: 13/477,586

(22) Filed: May 22, 2012

(65) Prior Publication Data
US 2013/0313012 A1 Nov. 28, 2013

(51) Int. Cl.
*H01K 3/10* (2006.01)
*H01L 21/48* (2006.01)
*H01L 21/683* (2006.01)
*H01L 23/498* (2006.01)

(52) U.S. Cl.
CPC ........ *H01L 21/6835* (2013.01); *H01L 21/4857* (2013.01); *H01L 21/486* (2013.01); *H01L 23/49822* (2013.01); *H01L 23/49827* (2013.01); *H01L 2221/68345* (2013.01); *H01L 2224/131* (2013.01); *H01L 2224/13109* (2013.01); *H01L 2224/13111* (2013.01); *H01L 2224/16237* (2013.01); *H01L 2924/014* (2013.01)
USPC .................. 29/852; 29/830; 29/832; 29/876; 29/879; 438/108

(58) Field of Classification Search
CPC ............... H01L 23/49827; H01L 2204/16225; H01L 2204/19041; H01L 2204/10253
USPC ............. 29/825, 830, 832, 846, 852; 438/108
See application file for complete search history.

(56) References Cited

U.S. PATENT DOCUMENTS

| | | | | |
|---|---|---|---|---|
| 5,786,628 | A * | 7/1998 | Beilstein et al. | 257/684 |
| 6,187,677 | B1 * | 2/2001 | Ahn | 438/667 |
| 6,281,042 | B1 * | 8/2001 | Ahn et al. | 438/108 |
| 6,570,248 | B1 * | 5/2003 | Ahn et al. | 257/724 |
| 6,582,979 | B2 * | 6/2003 | Coccioli et al. | 438/25 |
| 6,960,824 | B1 * | 11/2005 | Hashemi et al. | 257/698 |
| 2004/0229398 | A1 * | 11/2004 | Magerlein et al. | 438/106 |

OTHER PUBLICATIONS

Aitken et al., "1μm Alignment Accuracy Adhesive Wafer Bonding—Thermal and UV cure", System Integration, pp. 42-44, Apr. 2009.

(Continued)

*Primary Examiner* — Carl Arbes
(74) *Attorney, Agent, or Firm* — Lerner, David, Littenberg, Krumholz & Mentlik, LLP

(57) ABSTRACT

A method for forming an interconnection element having metalized structures includes forming metalized structures in an in-process unit that has a support material layer with first and second spaced-apart surfaces defining a thickness therebetween, a handling structure, and an insulating layer separating at least portions of the first surface of the support material layer from at least portions of the handling structure. The metalized structures are formed extending through the thickness of the support material layer. The method also includes etching at least a portion of the insulating layer to remove the handling structure from the in-process unit and further processing the in-process unit to form the interconnection element.

23 Claims, 9 Drawing Sheets

(56) References Cited

OTHER PUBLICATIONS

Puligadda et al., "High-Performance Temporary Adhesives for Wafer Bonding Applications", Mater. Res. Soc. Symp. Proc., vol. 970, Copyright 2007, Materials Research Society.

Williams et al., "Etch Rates for Micromachining Processing—Part II", Journal of Microelectromechanical Systems, vol. 12, No. 6, Dec. 2003, pp. 761-778.

Wu et al., "High aspect ratio silicon etch: A review", Journal of Applied Physics, vol. 108, No. 5, Sep. 2010.

Zhang et al., "Fast Copper Plating Process for TSV Fill", Microsystems, Packaging, Assembly and Circuits Technology, Oct. 2007.

Zoschke et al., "Evaluation of Thin Wafer Processing using a Temporary Wafer Handling System as Key Technology for 3D System Integration", Electronic Components and Technology Conference, 2010, pp. 1385-1392.

* cited by examiner

US 8,978,247 B2

TSV FABRICATION USING A REMOVABLE HANDLING STRUCTURE

BACKGROUND OF THE INVENTION

Interconnection components, such as interposers are used in electronic assemblies to facilitate connection between components with different connection configurations or to provide needed spacing between components in a microelectronic assembly. Interposers can include a dielectric element in the form of a sheet or layer of dielectric material having numerous conductive traces extending on or within the sheet or layer. The traces can be provided in one level or in multiple levels throughout a single dielectric layer, separated by portions of dielectric material within the layer. The interposer can also include conductive elements such as conductive vias extending through the layer of dielectric material to interconnect traces in different levels. Some interposers are used as components of microelectronic assemblies. Microelectronic assemblies generally include one or more packaged microelectronic elements such as one or more semiconductor chips mounted on a substrate. The conductive elements of the interposer can include the conductive traces and terminals that can be used for making electrical connection with a larger substrate or circuit panel in the form of a printed circuit board ("PCB") or the like. This arrangement facilitates electrical connections needed to achieve desired functionality of the devices. The chip can be electrically connected to the traces and hence to the terminals, so that the package can be mounted to a larger circuit panel by bonding the terminals of the circuit panel to contact pads on the interposer. For example, some interposers used in microelectronic packaging have terminals in the form of exposed ends of pins or posts extending through the dielectric layer. In other applications, the terminals of an interposer can be exposed pads or portions of traces formed on a redistribution layer.

Despite efforts devoted in the art heretofore to development of interposers and methods for fabricating such components, further improvement is desirable.

SUMMARY OF THE INVENTION

An aspect of the present disclosure relates to a method for forming an interconnection element having metalized structures. The method includes forming metalized structures in an in-process unit that has a support material layer with first and second spaced-apart surfaces defining a thickness therebetween, a handling structure, and an insulating layer separating at least portions of the first surface of the support material layer from at least portions of the handling structure. The metalized structures are formed extending through the thickness of the support material layer. The method also includes etching at least a portion of the insulating layer to remove the handling structure from the in-process unit and further processing the in-process unit to form the interconnection element. At least some of the metalized structures can be formed as metalized vias. Additionally or alternatively, at least some of the metalized structures can be formed as slots. The step of etching can etch at least a portion of the insulating layer exposed in the open area.

In an example, the handling structure can include a plurality of structural portions separated from the support material layer by the insulating layer prior to the removing step. The in process unit can have at least one open area through which the insulating layer is exposed, and the handling structure can be spaced away from the support material layer in the open area. In another example, the handling structure can include a plurality of openings formed through a thickness thereof in a direction of the thickness of the support material layer, and the openings can expose respective portions of the insulating layer in areas for formation of at least one metalized structure. The handling structure can alternatively include first portions thereof that are in contact with corresponding portions of the insulating layer and second portions that are spaced apart from the insulating layer in a direction of the thickness of the support material layer in respective areas for formation of at least one metalized structure. In another example, the handling structure can include a unitary outer portion contacting the insulating layer and defining an outer edge surface of the handling structure. The outer portion can surround a central open area of the handling structure that exposes an area of the first surface of the support material layer.

In another example, forming the metalized structures can include forming openings through the thickness of the support material layer by processing applied to the support material layer from above the first surface and from above the second surface thereof. Forming the metalized structures can further include depositing a metal within the openings. The metal can be deposited within the openings by processing applied to the support material layer from above the first surface and from above the second surface thereof. In another example, forming the metalized structures can include etching through the thickness of the support material layer from over the second surface thereof selectively relative to a material of the insulating layer. In any example, an etch rate of the support material layer by the etchant during the etching step can be greater than an etch rate of the insulating layer by at least a factor of 100.

In another example the first surface of the support material layer can extend in at least one lateral direction parallel to the second surface, and the insulating layer and the handling structure can extend continuously along the first surface in the at least one lateral direction from a first edge of the support material layer to a second edge thereof opposite to the first edge prior to removal of the handling structure. The method can further comprise segmenting the handling structure to expose the insulating layer thereon in at least one area prior to the step of etching. The handling structure can be segmented by one of sawing, reactive ion method etching, or laser dicing. The handling structure can be processed to reduce the thickness thereof prior to segmenting.

The step of further processing can include forming electrically conductive contacts connected with ends of the metalized structures exposed at at least one of the first or second surfaces of the support material layer. Additionally or alternatively, the step of further processing can include forming a redistribution layer over at least one of the first and second surfaces of the support material layer. The redistribution layer formation can include forming conductive contacts exposed at a surface of the redistribution layer and spaced from the ends of the metalized structures in one or more lateral directions therefrom and conductive interconnects connecting the end surfaces with the contacts. The redistribution layer can be formed over the first surface of the support material layer and can includes a portion of the insulation layer that remains after removal of the handling structure.

The insulating layer can contain a layer of at least one of an oxide or a nitride. The method can further include the step of forming the insulation layer on the handling structure by film lamination.

Another aspect of the present disclosure relates to an in-process unit including a support material layer having first and second spaced-apart surfaces defining a thickness therebetween and extending in at least one lateral direction defining a width thereof. The support material layer further has metalized structures extending through the thickness thereof with end surfaces exposed respectively at the first and second surfaces thereof. A handling structure extends in the at last one lateral direction and has a width substantially equal to that of the support material layer. An insulating layer separates at least portions of the first surface of the support material layer and at least portions of the handling structure. The in-process unit further includes a redistribution layer overlying the second surface of the support material layer and defining a redistribution surface remote from the second surface with redistribution contacts exposed thereon. In one example, the metalized structures can be metalized vias.

Another aspect of the present disclosure can relate to an in-process unit including a support material layer having first and second spaced-apart surfaces defining a thickness therebetween and extending in at least one lateral direction defining a width thereof. The support material layer further includes metalized structures extending through the thickness thereof and having end surfaces exposed respectively at the first and second surfaces thereof. A handling structure extends in the at last one lateral direction and has a width substantially equal to that of the support material layer. An insulating layer separates at least portions of the first surface of the support material layer and at least portions of the handling structure. At least some of the end surfaces of the metalized structures are spaced apart from the first or second surface of the support material layer in a direction normal thereto.

In an example, the metalized structures can be metalized vias. At least some of the end surfaces of the metalized structures can be spaced apart from the first or second surface of the support material layer so as to be positioned between the first and second surfaces. Additionally or alternatively, at least some of the end surfaces can be spaced apart from the first or second surface of the support material layer so as to be positioned outside of the support material layer.

In an embodiment, a contamination level of a metal from the metalized structures into the support material layer can be less than $10^{17}$ molecular units of the metal per cubic centimeter of the support material.

Another aspect of the present disclosure relates to a connection component. The connection component includes a support material layer having first and second spaced-apart surfaces defining a thickness therebetween and extending in at least one lateral direction defining a width thereof. Metalized structures extend through the thickness of the support material layer and have end surfaces exposed respectively at the first and second surfaces thereof. A contamination level of a metal from the metalized structures into the support material layer is less than $10^{17}$ molecular units of the metal per cubic centimeter of the support material.

BRIEF DESCRIPTION OF THE DRAWINGS

Various embodiments of the present invention will be now described with reference to the appended drawings. It is appreciated that these drawings depict only some embodiments of the invention and are therefore not to be considered limiting of its scope.

DETAILED DESCRIPTION

Figure 7:
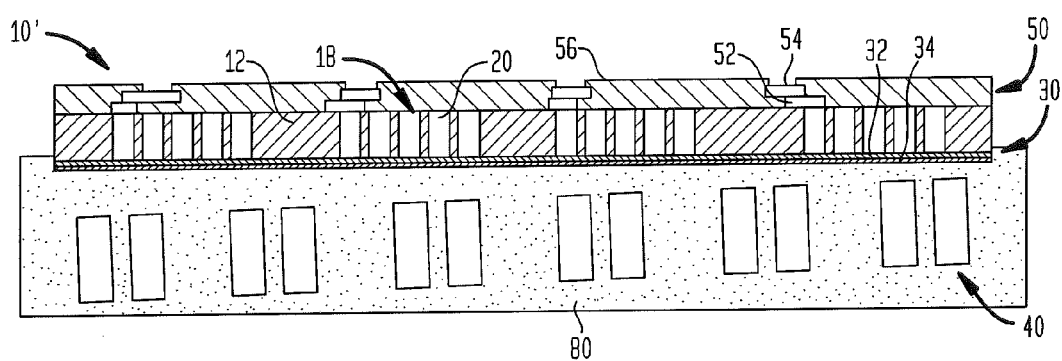
Figure 8:
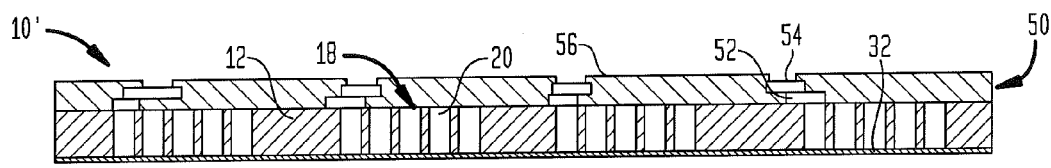
Figure 9:
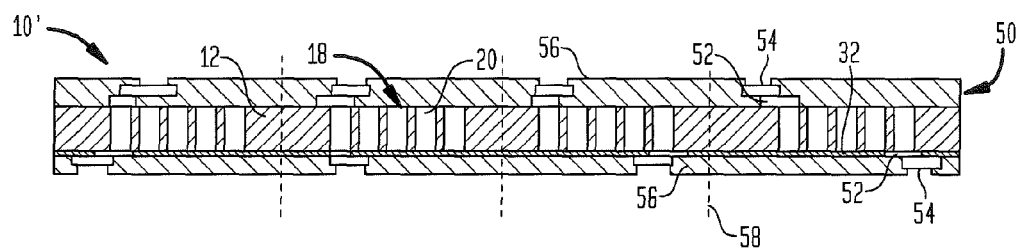

Turning now to the figures, where similar numeric references are used to refer to similar features, an in process unit 10' is shown in FIGS. 1-9 in various stages of a process used to form an interposer 10. In the stage of the process shown in FIG. 1, the in-process unit 10 includes a support material layer 12 bonded with or otherwise carried on a handling structure 40. The method steps described herein can be used to form an interposer 10, as shown in FIG. 9, for example, with support material layer 12 spacing apart and supporting a plurality of metalized structures, which can include metalized vias 20 that extend therethrough and with handling structure 40 being removed therefrom to be either reused in a subsequent process or to be discarded. In other embodiments the metalized structures can be in the form of metalized slots that include a width and extend along a length thereof in one or more lateral directions that is greater than the width. Other embodiments can include combinations of metalized vias and metalized slots.

In the exemplary finished interposer 10' shown in FIG. 9, metalized vias 20 can have end surfaces 22 and 24 remote from each other with an edge surface 26 extending therebetween. End surfaces 22 and 24 are left uncovered by the support material layer 12 on corresponding surfaces 14 and thereof. Widths of the end surfaces 22 and 24 are generally in a range from about 50 to 1000 μm, for example, 200-300 μm. The metalized vias 20 can be formed at locations facilitating connectivity between elements of a microelectronic assembly. Such metalized vias may have different form factors and be organized, for example, in one or more grid-like patterns having a pitch in a range from 100 to 10000 microns (e.g., 400-650 microns).

Support material layer 12 can be formed from, for example, compositions which cure by chemical reaction to form a polymeric dielectric, such as epoxies, polyimides, or various plastics. The material used for support material layer can further include one or more additives influencing properties thereof. For example, such additives can include particulate materials such as silica or other inorganic dielectrics, or fibrous reinforcements such as short glass fibers. Dielectric materials can be used to form support material layer 12, including various low-temperature co-fired ceramics, various liquid-crystal polymers ("LCP"), and glass. Certain composite materials having an epoxy matrix can also be used. Such materials can include high filler content epoxy composites, wherein the filler is formed from glass or other similar materials. In other examples silicon or other semiconductor materials can be used to form support material layer 12. The material selection and additives used can result in the support material layer 12 having a coefficient of thermal expansion ("CTE") within a desired range. For example, the CTE of support material layer 12 can be less than 20 ppm/° C. In another example, the CTE can be 14 ppm/° C. or less, or 8 ppm/° C. or less. In some instances, the support material layer 12 can be made without consideration of its CTE.

As shown in the Figures, interconnection component is free from any electrically conductive interconnects running between the metalized vias 20 or elsewhere in an at least partially lateral direction (parallel to the surfaces 14,16 of support material layer 12) within the material between the end surfaces 22 and 24. Traces 52 or the like can be used to form connections running in a lateral direction outside of the area between end surfaces 22 and 24. In an example, there are no lateral connections within support material layer 12. In another example, within support material layer 12 the only connections formed are by metalized vias 20 between the surfaces, 14 and 16, of support material layer 12.

Figure 10:
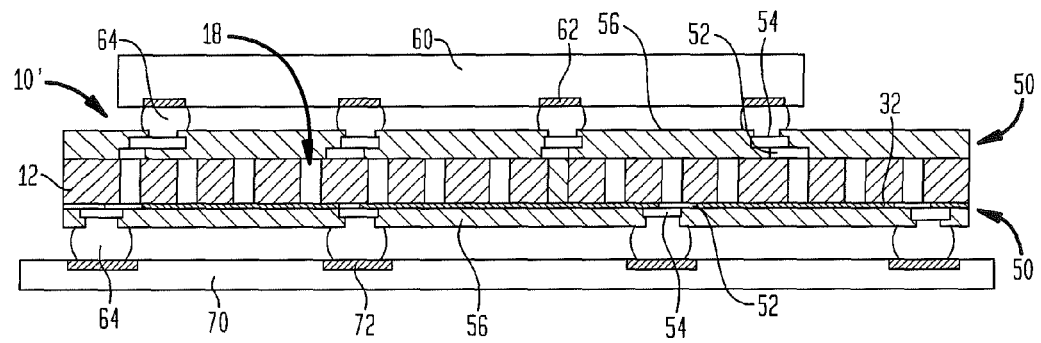
FIG. 10 shows a microelectronic assembly including an interconnection component according to an aspect of the present disclosure.

As further shown in FIG. 10, wettable contacts can be provided as pads 54 respectively electrically interconnected with either or both end surfaces 22 and 24 through traces 52 and other electrically conductive structure, e.g. conductive vias 18. In one example, traces 52 can electrically connect to and overlie respective end surfaces 22 and 24 and extend away therefrom in a direction parallel to surfaces 14 and 16 in a redistribution layer 50. Traces 52 can be used to provide a wettable contact at a laterally offset position from the location of a respective end surface 22 or 24. In the embodiment shown in FIG. 10, multiple layers of traces 52 are formed within a redistribution dielectric 56 of redistribution layer 50; however, a single layer could be used to achieve a desired offset configuration. The layers of traces 52 can be separated from one another by portions of the redistribution dielectric 56 that extend between the traces 52, both in different layers and within the same layer. The traces 52 can be connected, as desired, between layers using conductive vias, which can be formed through portions of redistribution dielectric 56.

Traces 52 can have different widths, including widths which are smaller than the widths of end surfaces 22 and 24 of the metalized vias 20. This facilitates fabrication of an interconnection component having high routing density. Generally, the widths of traces 52 are selected in a range from about 0.5 to 100 microns (e.g., 5-40 microns); however, portions of traces (such as portions of traces 52 used as wettable contacts) or some traces, themselves, can have widths greater than 100 μm. Together with the metalized vias 20, traces 52 can form an electrical circuit of interconnection component 10. Each trace 52 can be connected to at least one metalized via 18 or to at least one other trace. However, some traces can "float", in that they can be electrically disconnected from metalized vias and other traces. Likewise, one or more of the posts can remain unconnected to any traces.

An embodiment of interconnection component 10 having one or more redistribution layers 50 can allow interconnection component 10 to be used to connect to a microelectronic component having a different connection configuration than the configuration of metalized vias 18. In particular, interconnection component 10 can be configured with a redistribution layer that gives an array of wettable contacts different pitches on either side thereof. In one example, the wettable contacts overlying surface 14 can have a greater pitch than the wettable contacts overlying surface 16 or vice versa. As shown in FIG. 10, the pitch of pads 54 used as wettable contacts over surface 14 is greater than the pitch of the wettable contacts formed by vias 54 over surface 16. In the example of FIG. 10, pads 54 that respectively overlie surface 14 are electrically connected with end surfaces 22 of respective ones of metalized vias 18. Such pads 54 are joined to contacts 62 on a microelectronic element 60 by solder balls 64. Other materials can be used in place of solder balls 64 to join features of the components of the assembly such as tin, indium, or a conductive matrix. Similarly, pads 54 over surface 16 are electrically connected with end surfaces 24 of respective ones of the metalized vias 18. Such pads 54 are joined to contacts 72 of a circuit panel 70 by additional solder balls 64.

Additional wettable metal layers or structures can be added to interconnection component 10 that can be wettable contacts for connection to other microelectronic components. Such wettable metal layers or structures can be made from nickel or Ni—Au, or organic solderable preservative ("OSP"). Structures that can be wettable contacts include portions of traces 52 or pads 54 that can be patterned with traces 52 or can overlie traces 52 or end surfaces 22,24. In other examples, end surfaces 22 or 24 themselves can be wettable contacts used to connect metalized vias 18 to another component using solder balls or other conductive materials.

Microelectronic elements, or devices, can be mounted on interconnection component 10 using techniques such as a ball-bonding, as shown, or using other techniques. Similarly, such techniques may be used for connecting the substrates stacked on one another as additional components to the assemblies shown herein. Further examples of such assemblies are shown and described in U.S. Pat. No. 7,759,782 and in U.S. Pat. Application. Pub. No. 2010/0273293, the disclosures of which are hereby incorporated by reference herein in their entireties. For example, an interconnection component can be disposed on and connected to a PCB that includes an electrically conductive EMI shield. The end surfaces of the posts can then be solder bonded to contact pads of the PCB with the EMI shield being ball-bonded to a peripheral trace of the interconnection component for grounding to the shield Further, the interconnection components discussed herein can be interconnected to form multi-interposer assemblies. Such an assembly, can include two interconnect components that overlie each other. One of the stacked interconnect components can, for example, have a recess formed in the molded dielectric layer thereof to receive, without electronic connection to, a microelectronic package bonded to the other interconnect component.

Figure 1:
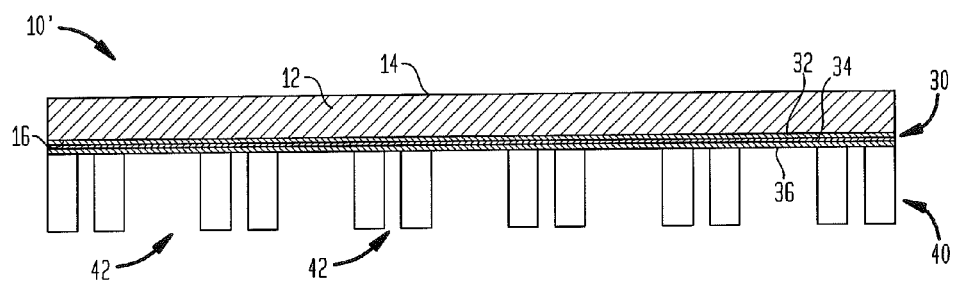
FIG. 1 shows an elevational schematic view of an in-process unit that can be processed to form an interconnection component in various method steps of the present disclosure.
Figure 2:
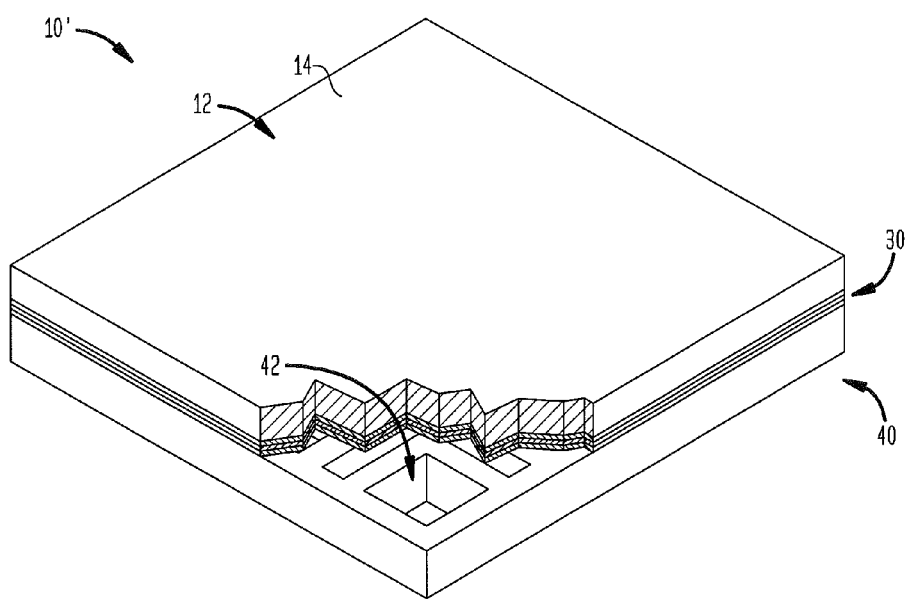
FIG. 2 shows an isometric view of the in-process unit of FIG. 1.

A method for making an interconnection component that can be similar to that shown in FIG. 10 is described herein with reference to the depictions of in-process unit 10' 10 during various stages of the method by which in-process unit 10' is made into interconnection component 10. As shown in FIGS. 1 and 2, in-process unit 10' can initially be formed as a support material layer 12 assembled with a handling structure 40. Support material layer 12 can be a solid monolithic layer of the desired material for the support material layer 12 for the finished interconnection component 10. Such material can be any of those discussed above with respect to the example finished interconnection component 10 of FIG. 10. In an example, support material layer 12 can be a layer of silicon. The support material layer 12 is depicted as a wafer, but can also be sized for package-level or panel-level construction of the interconnection component. The thickness of support material layer 12 can be configured to match that of the desired thickness for the support material layer 12 in the finished interconnection component. That is, while many interconnection component fabrication processes (in particular those for the fabrication of interposers and the like) involve the fabrication of a support material layer or an equivalent thereof from a much thicker initial material layer that is ground down, for example after formation of metalized vias or the like, to a final desired thickness, the use of the handling structure 40 can allow for support material layer 12 to have an initial thickness closer to that which is desired for the final interconnection component.

As mentioned above, the initial thickness of support material layer 12 can be the same as that of the desired final thickness. The use of the handling structure 40 can allow for such a thickness of support material layer 12 during fabrication at thicknesses thereof that would otherwise be too fragile for handling or processing during the subsequent method steps described herein or otherwise used. For example, wafer-level fabrication of an interconnection component such as that shown in FIG. 10 that is carried out without the use of a handling structure 40 can require an initial thickness for support material layer 12 that is at least about 200% the desired final thickness. In variations of the current method utilizing a handling structure 40 where some grinding or polishing of support material layer is desired during or between process steps, an initial thickness of support material layer 12 can be greater than the desired final thickness, but can be greater to a lesser extent than methods without a handling structure 40. For example such an initial thickness can be less than or equal to 150% of the desired final thickness. In other examples, such an initial thickness can be less than or equal to about 110% of the desired final thickness, or within 101% of such a desired final thickness.

In the example shown in FIGS. 1 and 2, the handling structure 40 can be configured to be re-usable and can be made from glass in an embodiment where support material layer is made, for example, from silicon or the like. In other examples, handling structure 40 can be made from a material that is different from that of support material layer 12 such that any etchants used in processing support material layer 12, such as to form vias therein, do not attack or cause degradation of handling structure 40. Handling structure 40 can have a thickness that is configured to give a desired level of physical support for support material layer 12, given the desired thickness for support material layer 12 and the type of processing to be carried out thereon. For example, handling structure can have a thickness that is at least as thick as the support material layer 12. The thickness of support material layer 12 can be between about 1 micron and 400 microns, or in some examples 100 microns or below, or in other examples between 3 microns and 20 microns. In an embodiment, handling structure 40 can have a thickness of at least 200 microns.

Support material layer 12 and handling structure 40 can be removably bonded together using any number of materials. For example, various adhesives, including those that are dissolvable in water or other solutions, can be used, as can polymeric materials that can also be dissolved in a solution, melted or removed by other chemical or physical means. In other embodiments, support material layer 12 and handling structure 40 can be removably bonded together by an insulation layer that can include one or more layers of material that can adhere to each other and/or to at least one of handling structure 40 and support material layer 12. In the example shown in FIGS. 1 and 2, support material layer 12 and handling structure 40 are removably bonded together by a bonding layer 30 that can include one or more sub-layers selected to have different properties that are advantageous in one or more of the subsequent processing steps described herein.

In the example shown, bonding layer 30 includes three sub-layers: first sub-layer 32, second sub-layer 34, and third sub-layer 36, although a single, layer, two layers, or more than three layers can be used. In an example, at least one sub-layer can be an insulating layer having a selective etch rate that is lower than that of the support material layer for an etchant selected to form vias in support material layer. Other layers can be a release layer, selected to dissolve in a solvent or the like, for example. In one example, where support material layer 12 is made from silicon, first sub-layer 32 can be $SiO_2$, second sub-layer 34 can be SiN, and third sub-layer 36 can be $SiO_2$ (other silicon oxides can also be used). In another variation, first and third sub-layers 32 and 36 can be polyimide and second sub-layer 34 can be SiO2. Other materials that can be used for one or more sub layers include SiCN. In an example, first sub layer 32 can be selected to act as an insulation layer that is resistant to the etchant used to form vias in the support material layer 12. In an embodiment, where support material layer 12 is Si, first sub-layer 32 and third sub-layer 36 can be SiN. In such an example, the second sub-layer can be selected as a release layer and can, for example, be a silicon oxide ($SiO_x$). Such layers can be formed by oxide/nitride growth (depending on the material used) or can be formed by film lamination.

As shown in FIGS. 1 and 2, handling structure 40 can include a plurality of openings 42 formed therein. Such openings 42 can be present to increase the mechanical strength of handling structure 40 when removably bonded to support material layer 12 or can be present to allow a solution, such as an etchant, solvent, or water, to reach portions of the bonding layer 30 for removal thereof. The use of openings 42 can also decrease the overall weight of in-process unit 40. The shape and arrangement of such openings 42 can be in any substantially uniform configuration that can provide the desired strength for handling structure 40, given the desired material and thickness thereof. An example arrangement can be seen in FIG. 2, where portions of support material layer 12 and bonding layer 30 are cut-away.

Figure 3:
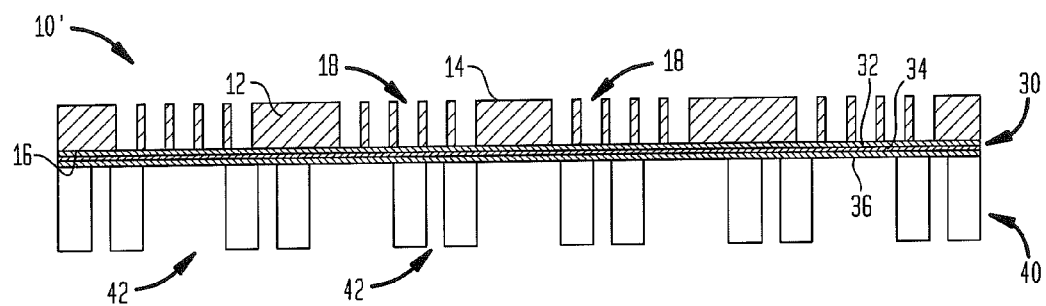
FIGS. 3-9 show the in-process unit of FIG. 1 in further steps of the method for making an interconnection component.

As shown in FIG. 3, a plurality of vias 18 can be formed in support material layer 12. Such vias 18 can be formed in any configuration, including size and position, thereof desired for the finished interconnection component. Further, the vias 18 can be formed using any of a number of methods, including the use of chemical etchants, as described above, or using physical means, such as drilling or laser-etching. Although the examples of the vias 18 shown in the Figures are generally uniform in their size and relative distribution, the use of an insulation sub-layer within bonding layer 30, as described above, can be useful in forming vias 18 of differing sizes using a chemical etching process. For example, when forming vias of differing sizes in a monolithic support material layer without a handling structure bonded thereto, the different times required to etch away the support material to different via widths will also cause the vias to extend to different depths. To maintain adequate strength during this step and other steps, it may be necessary to make the support material layer thick enough so that the widest (and also deepest) via does not extend therethrough. This can add to the required initial thickness of such a support material layer. However, the presence of a handling structure 40 can allow for differently-sized vias 18 to be formed without requiring a thicker support material layer 12.

Figure 4:
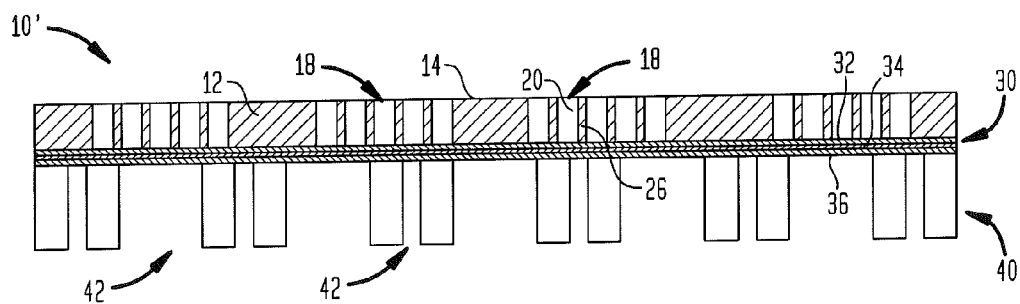

In the process step shown in FIG. 4, vias 18 are filled with a conductive material 20 to form metalized vias supported and spaced apart by support material layer 12, as discussed above with reference to FIG. 10. Vias 18 can be filled, for example with copper, a copper alloy, or other conductive metals such as gold, silver, aluminum or the like by electroplating, electroless plating, chemical vapor deposition (CVD) or the like. In embodiments where support material layer 12 is of silicon or another semiconductor material or of a conductive material, a barrier layer can first be deposited on the edge surfaces 26 of vias 18. Such a barrier layer can be of a dielectric material. In other embodiments where support material layer 12 is itself of a dielectric material no such barrier layer is necessary. In either example, a seed layer can be deposited along the edge surface 26 of a via 18 formed in a dielectric support material layer 12 or over the barrier layer of a via 18 formed in a semiconducting or conductive support material layer 12. Such a seed layer can be deposited by sputtering, CVD or other processes and can be a material that can adhere to a dielectric material that can also maintain a charge so as to be usable in a plating process. Once a seed layer is applied, the fill material 20 can be deposited within vias and built up to define end surfaces 22 and 24 exposed respectively on first 14 and second 16 surfaces of the support material layer 12.

Figure 15:
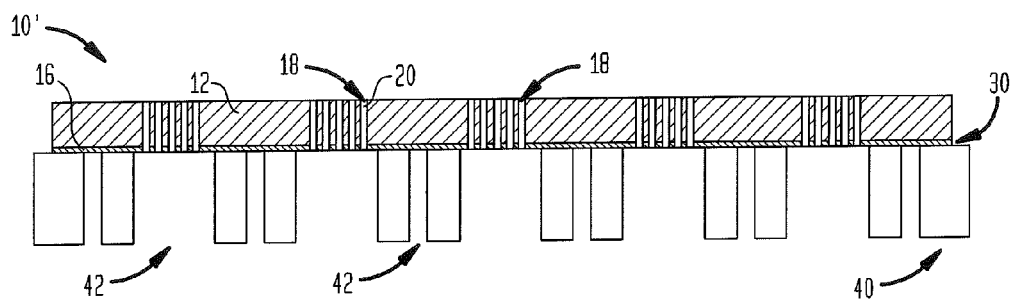
FIG. 15 shows another in-process unit that can be processed to form an interconnection component according to method steps of an embodiment of the present disclosure.

In a variation of this step, shown in FIG. 15, portions of the bonding layer 30 can be patterned to provide openings over surface 16 through which vias 18 can be formed by etching from over both surface 14 and surface 16 of support material layer 12. Similarly, the fill metal 20 can be deposited (as can any barrier layer and seed layer) from over surface 14 as well as surface 16 due to the open structure of the handling structure 40 shown.

If desired, vias 18 can be planarized to be flush with the respective surfaces 14 and 16; however this can be avoided to minimize the possibility of contamination of the fill metal 20. In the method described herein, the need for such planarization may be minimal because the present process for forming metalized vias 18 can result in variations in height among the vias 18 of less than 1%. For example, height variations across an individual die of 300 microns of vias 18 formed by such a process can be less than 1 micron.

At this point, if no further structures or processing of the in-process unit 10' is needed; handling structure 40 can be removed, as discussed below. This can result in an interconnection component in the form of an interposer having vias 18 in a support material layer 12 having wettable contacts defined by the opposing end surfaces 22 and 24 of the vias and having substantially identical pitches over both of the opposing surfaces 14 and 16 of the support material layer 12. Such removal is further described below with respect to FIGS. 6 and 7.

Figure 5:
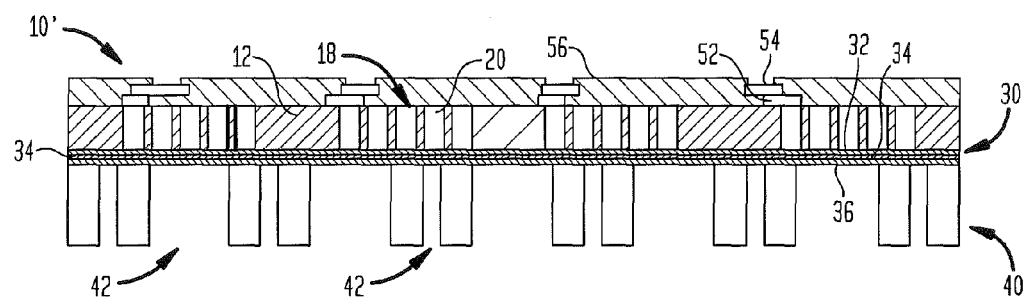

If an interconnection component such as that shown in FIG. 10 is desired or another interconnection component with at least one redistribution layer 50 is desired, such a redistribution layer, as described above, can be formed over surface 14 of support material layer 12 and over ends 22 of metalized vias 18, as shown in FIG. 5. Such a redistribution layer can be formed by plating or otherwise depositing a conductive material over surface 14, patterning that material to form traces and optionally pads 54 that are connected with ends 22 of vias 18. The traces 52 can then be covered with a dielectric material 56 with any pads 54 being left exposed as wettable contacts or with additional metalized vias (not shown) being formed thereover to connect with another layer of the RDL formed similarly.

Figure 6:
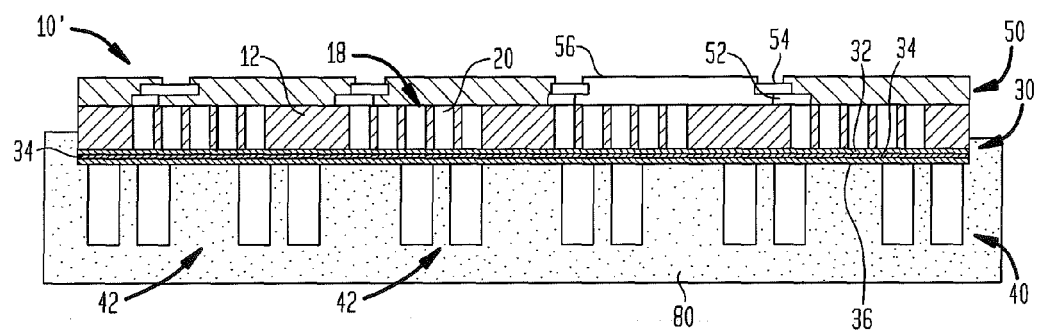

As shown in FIGS. 6 and 7, handling structure 40 can then be removed from in-process unit 10'. This can be done, for example, by dipping in-process unit 10' into a solution configured to dissolve or otherwise attack or remove all or a portion of the bonding layer 30 with no or minimal damage to the handling structure 40 itself or the support material layer 12, vias 18 or the components of the RDL. The etchant solution can include a coupling, passivation, or complexing, agent that can bind with copper, for example, to further minimize any removal of the fill metal 20 within the vias 18. Such coupling agents can include BTA-Benzotriazol moieties. For example, in an arrangement with three sub layers 32, 34, and 36 in bonding layer 30, the etchant can be configured to attack the third sub-layer 36, leaving first 32 and second 34 sub layers intact. In other arrangements, a first sub-layer can be present adjacent the support material layer 12 and a second sub-layer can be adjacent the handling structure 40 with the etchant configured to remove the second sub layer. In some arrangements, it can be desirable to leave first sub-layer 32 intact adjacent to and bonded with surface 16 of support material layer.

As shown in FIG. 7, such a removal process can be such that the handling structure 40 remains intact with minimal damage due to the exposure to the etchant solution. Accordingly, the handling structure 40 can be retrieved from the solution for re-use in a subsequent process of this type. Depending on the sub-layer structure of bonding layer 30, portions of at least one of the sub-layers can remain on the handling structure 40. Such remnants can be left in place or removed prior to subsequent use. Similarly, portions of one or more sub-layers of the bonding layer 30 can remain on surface 16 of in-process unit 10'. In the example shown, where the solution 38 is configured to attack third sub-layer 36, portions thereof can remain over first sub-layer 32 when handling structure 40 is released from support material layer 12. Such portions can be removed by continued exposure to the solution 38 or by grinding, lapping, polishing or the like. Additionally, second sub-layer 34 can be removed by exposure to a different etchant, or by mechanical means such as grinding, lapping or polishing. In embodiments where first sub layer 32 and third sub layer 36 are of the same material (or materials that are attacked by common etchants), second sub layer 34 can protect first sub layer 32 when in-process unit 10' is exposed to an etchant for the purpose of removing third sub layer 36. The resulting structure can then be exposed to another etchant that attacks second layer 34 to remove it from the structure with first sub layer 32 acting as an etch-stop.

As shown in FIG. 8, it may be desired to leave first sub-layer 32 in place over surface 16 of support material layer 12. This may be particularly useful when a redistribution layer 50 is also desired over surface 16. In such an instance, where first sub-layer 32 is an insulating layer or otherwise has dielectric properties, the sub-layer 32 can be used as a part of the redistribution structure. This can be done by patterning sub-layer 32 to expose end surfaces of vias and to define areas therein for traces 52. Conductive metal can then be deposited into such patterned areas to form traces 52 and/or pads 54. If desired, subsequent layers of the RDL 50 can be formed by the process steps described above. The resulting structure, shown in FIG. 9, can be segmented along lines 58, for example, to form package-sized interconnection components 10 that can be used to interconnect microelectronic components, as described above with reference to FIG. 10, for example.

Figure 11:
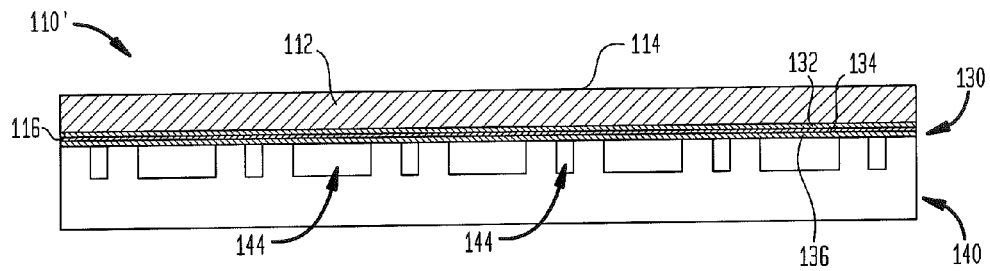
FIG. 11 shows an elevational schematic view of another in-process unit that can be processed to form an interconnection component in various method steps similar to those shown in FIGS. 3-9.
Figure 12:
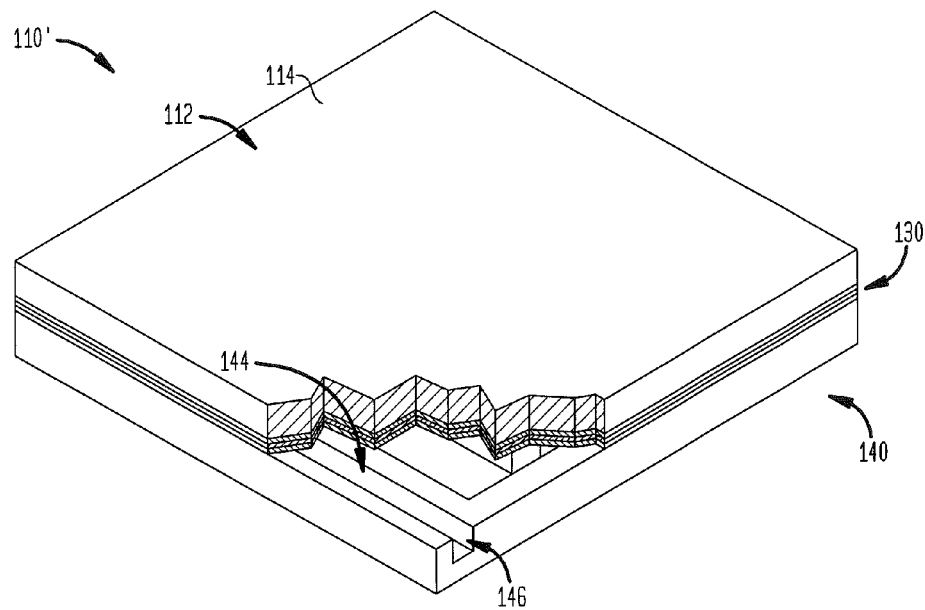
FIG. 12 shows an isometric view of the in-process unit of FIG. 11.

FIGS. 11 and 12 show an alternative variation of a removable handling structure 140 that can be used to provide support and protection for a support material layer 112 during the process steps described above with respect to FIGS. 1-10. Such a handling structure 140 can include one or more channels 144 that can be interconnected and that provide areas of the handling structure that alternately contact and are spaced away from the bonding layer 130. The structure of channels 144 can also allow for a unitary portion of the handling structure 140 beneath channels 144, which can increase the overall strength or reduce the thickness of in-process unit 110'. One or more of the channels 144 can include an opening 146 to an exterior of the handling structure 140 to allow a solution, such as an etchant solution, to flow into channels 144 to remove a portion of the bonding layer 130 for removal of the handling structure 140, as described above with respect to FIGS. 6 and 7.

Figure 13:
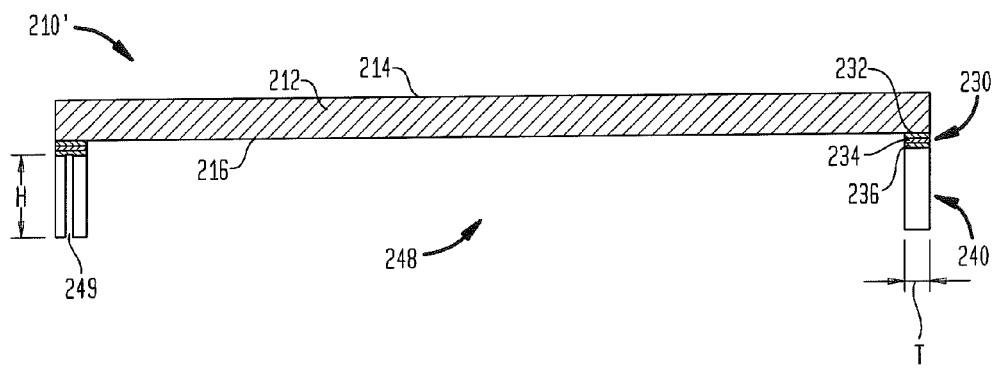
FIG. 13 shows an elevational schematic view of another in-process unit that can be processed to form an interconnection component in various method steps similar to those shown in FIGS. 3-9.
Figure 14:
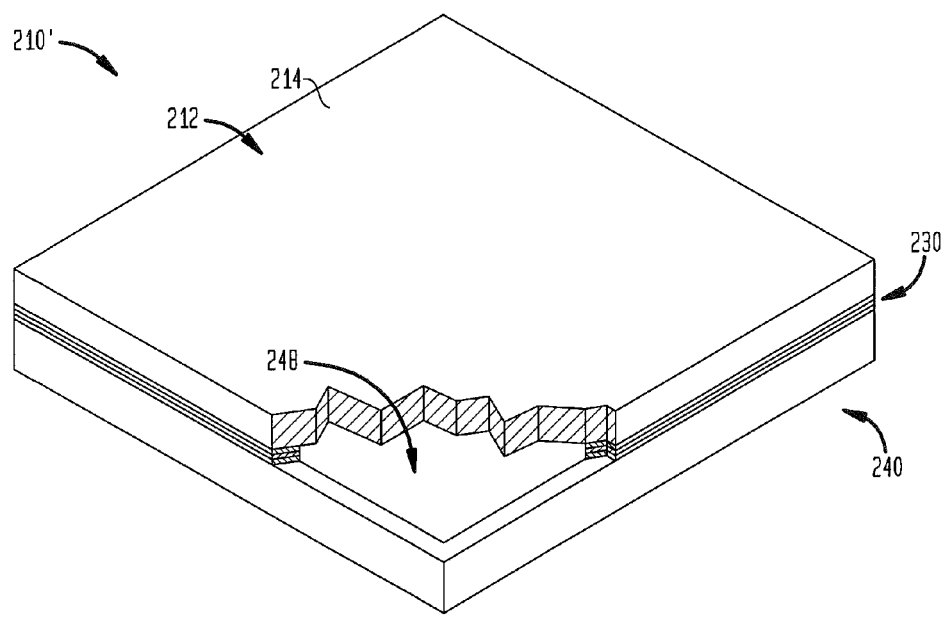
FIG. 14 shows an isometric view of the in-process unit of FIG. 13.

FIGS. 13 and 14 show a further alternative variation of a handling structure 240 for use in the method steps described above in connection with processing of support material layer 212. In this variation, handling structure 240 includes a single opening 248 therein leaving handling structure 240 in contact with bonding layer 230 around a perimeter of the support material layer 212. Such a structure can reduce the necessary size of the bonding layer 230 to also just around the perimeter of support material layer 212, leading to faster and potentially more reliable removal of handling structure 240. Such a structure can also facilitate etching of vias 218 or plating of fill metal 220 from over both surfaces 14 and 16 of support material layer 212, as discussed above. In an example, handling structure can have a height H of at least 3 mm. Further handling structure can be configured such that the thickness T of the handling structure, as it surrounds opening 248 is between 2 mm and 3 mm. In other embodiments, the thickness T can be greater than 3 mm. Additionally, handling structure can include one or more perforations 249 that extend in the direction of the height H of the handling structure. Such perforations 249 can help expose insulation layer 230 to the solution used to facilitate removal of handling structure 240 from support material layer 212 to increase the speed and reliability of the removal process. In an example, as shown in FIGS. 13 and 14, the handling structure 240 can substantially align with the support material layer 212 along peripheral edge surfaces thereof. In another example, the handling structure 240 can be larger at least in lateral dimensions than the support material layer 212 such that the outer periphery of the handling structure 240 is positioned laterally beyond the outer periphery of the support material layer 212.

Figure 16:
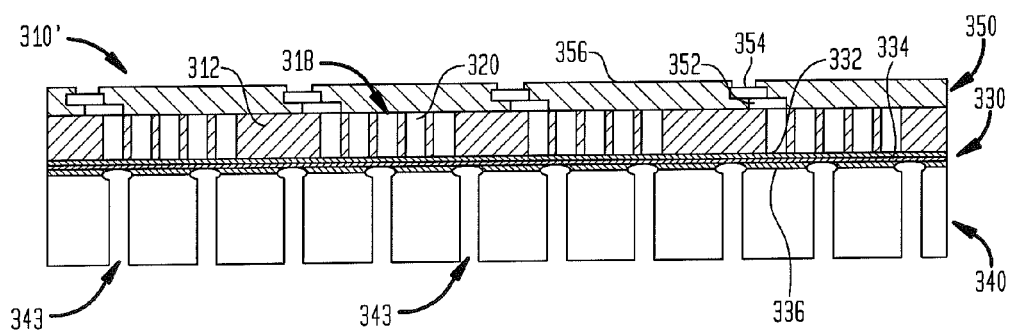
FIGS. 16-18 show another in-process unit in various stages of processing to form an interconnection component according to method steps of an embodiment of the present disclosure.
Figure 17:
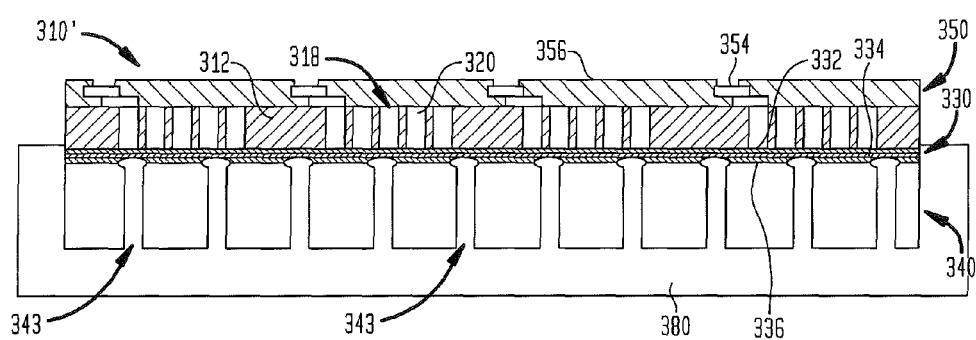
Figure 18:
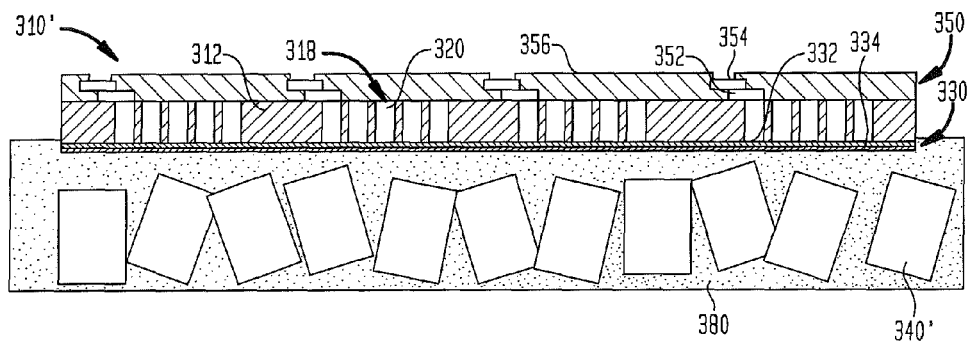

In another variation of the above-described method, a handling structure 340 can be configured for a single use. FIGS. 16-18 show various stages of such a method carried out on an in-process unit 310' that includes a support material layer 312 removably bonded to a handling structure 340 by a bonding layer 330 that can be of any of the types described above in the example of FIGS. 1-10. In the present example, during the steps carried out to form metalized vias 318 and to form RDL 50 over surface 324 of support material layer 312, the handling structure 340 can be a monolithic slab of a material suitable for providing the desired support and protection for support material layer 312 at a desired thickness. In an example, the handling structure can be of the same material as support material layer 312, such as silicon. Other materials, such as glass, dielectrics, or various metals can also be used. As shown in FIG. 16, to remove such a monolithic handling structure 340, the handling structure 340 can first be segmented to expose portions of the bonding layer 330 in openings 343 throughout the interface between handling structure 340 and support material layer 312. This can be done by sawing, laser etching or the like. The thickness of the handling structure 340 can also be reduced prior to such a process by partial etching, grinding or the like. When exposed to an etchant solution 380, this can cause the portions 340' of support structure left after segmentation to release from the remaining in-process unit 310'.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method for forming an interconnection element having metalized structures, comprising:
   forming metalized structures in an in-process unit, the in-process unit including a support material layer having first and second spaced-apart surfaces defining a thickness therebetween, a handling structure, and an insulating layer separating at least portions of the first surface of the support material layer from at least portions of the handling structure, the metalized structures being formed extending through the thickness of the support material layer; and
   etching at least a portion of the insulating layer to remove the handling structure from the in-process unit; and
   further processing the in-process unit to form the interconnection element.

2. The method of claim 1, wherein at least some of the metalized structures are formed as metalized vias.

3. The method of claim 1, wherein at least some of the metalized structures are formed as slots.

4. The method of claim 1, wherein the handling structure includes a plurality of structural portions separated from the support material layer by the insulating layer prior to the removing step, the in-process unit having at least one open area through which the insulating layer is exposed, the handling structure being spaced away from the support material layer in the open area, and wherein the step of etching at least a portion of the insulating layer includes bringing the insulating layer into contact with an etchant solution at least through the at least one open area.

5. The method of claim 4, wherein the handling structure includes a plurality of openings formed through a thickness thereof in a direction of the thickness of the support material layer, and wherein the openings expose respective portions of the insulating layer in areas for formation of at least one metalized structure.

6. The method of claim 4, wherein the handling structure includes first portions thereof that are in contact with corresponding portions of the insulating layer and second portions that are spaced apart from the insulating layer in a direction of the thickness of the support material layer in respective areas for formation of at least one metalized structure.

7. The method of claim 4, wherein the handling structure includes a unitary outer portion contacting the insulating layer and defining an outer edge surface of the handling structure, the outer portion surrounding a central open area of the handling structure that exposes an area of the first surface of the support material layer, and wherein the step of etching at least a portion of the insulating layer includes bringing the insulating layer into contact with an etchant solution at least through the central open area.

8. The method of claim 7, wherein the handling structure further includes a plurality of secondary openings extending in a direction of a height of the handling structure that expose portions of the insulating layer on a surface of the handling structure opposite the insulating layer, and wherein the step of etching further includes bringing the insulating layer into contact with the etchant solution through the secondary openings.

9. The method of claim 4, wherein the step of etching etches at least a portion of the insulating layer exposed in the open area.

10. The method of claim 4, wherein forming the metalized structures includes forming openings through the thickness of the support material layer by processing applied to the support material layer from above the first surface and from above the second surface thereof, and depositing a metal within the openings to form the metalized structures.

11. The method of claim 10, wherein the metal is deposited within the openings by processing applied to the support material layer from above the first surface and from above the second surface thereof.

12. The method of claim 4, wherein forming the metalized structures includes forming openings through the thickness of the support material layer and depositing a metal within the openings to form the metalized structures by processing applied to the support material layer from above the first surface and from above the second surface thereof.

13. The method of claim 1, wherein forming the metalized structures includes etching through the thickness of the support material layer from over the second surface thereof selectively relative to a material of the insulating layer.

14. The method of claim 13, wherein during the etching an etch rate of the support material layer by the etchant is greater than an etch rate of the insulating layer by at least a factor of 100.

15. The method of claim 13, wherein the first surface of the support material layer extends in at least one lateral direction parallel to the second surface and wherein the insulating layer and the handling structure extends continuously along the first surface in the at least one lateral direction from a first edge of the support material layer to a second edge thereof opposite to the first edge prior to removal of the handling structure.

16. The method of claim 13, further comprising segmenting the handling structure to expose the insulating layer thereon in at least one area prior to the step of etching.

17. The method of claim 16, wherein the handling structure is segmented by one of sawing, reactive ion method etching, or laser dicing.

18. The method of claim 16, wherein the handling structure is processed to reduce a thickness thereof prior to segmenting.

19. The method of claim 1, wherein the step of further processing includes forming electrically conductive contacts connected with ends of the metalized structures exposed at at least one of the first or second surfaces of the support material layer.

20. The method of claim 1, wherein the step of further processing includes forming a redistribution layer over at least one of the first and second surfaces of the support material layer, including forming conductive contacts exposed at a surface of the redistribution layer and spaced from the ends of the metalized structures in one or more lateral directions therefrom and conductive interconnects connecting the end surfaces with the contacts.

21. The method of claim 20, wherein the redistribution layer is formed over the first surface of the support material layer and includes a portion of the insulation layer that remains after removal of the handling structure.

22. The method of claim 1, wherein the insulating layer contains a layer of at least one of an oxide or a nitride.

23. The method of claim 1, further including the step of forming the insulation layer on the handling structure by film lamination.

\* \* \* \* \*